United States Patent
Yamamoto et al.

(10) Patent No.: US 9,890,293 B2
(45) Date of Patent: Feb. 13, 2018

(54) PROTECTIVE FILM FORMING COMPOSITION, PROTECTIVE FILM FORMING SHEET, AND CHIP PROVIDED WITH PROTECTIVE FILM

(71) Applicant: LINTEC CORPORATION, Itabashi-ku (JP)

(72) Inventors: Daisuke Yamamoto, Warabi (JP); Hiroyuki Yoneyama, Nagareyama (JP)

(73) Assignee: LINTEC CORPORATION, Itabashi-ku (JP)

( * ) Notice: Subject to any disclaimer, the term of this patent is extended or adjusted under 35 U.S.C. 154(b) by 0 days.

(21) Appl. No.: 15/032,515

(22) PCT Filed: Nov. 10, 2014

(86) PCT No.: PCT/JP2014/079759
§ 371 (c)(1),
(2) Date: Apr. 27, 2016

(87) PCT Pub. No.: WO2015/068842
PCT Pub. Date: May 14, 2015

(65) Prior Publication Data
US 2016/0272839 A1    Sep. 22, 2016

(30) Foreign Application Priority Data

Nov. 8, 2013   (JP) ................................ 2013-231940
Oct. 16, 2014  (WO) ................. PCT/JP2014/077578

(51) Int. Cl.
| | |
|---|---|
| C08K 3/38 | (2006.01) |
| C09D 133/08 | (2006.01) |
| C08K 3/00 | (2018.01) |
| C08L 33/06 | (2006.01) |
| C09D 133/06 | (2006.01) |
| C08J 5/18 | (2006.01) |
| H01L 21/56 | (2006.01) |
| H01L 23/29 | (2006.01) |
| C09D 163/00 | (2006.01) |

(52) U.S. Cl.
CPC .............. *C09D 133/08* (2013.01); *C08J 5/18* (2013.01); *C08K 3/00* (2013.01); *C08L 33/06* (2013.01); *C09D 133/06* (2013.01); *C09D 163/00* (2013.01); *H01L 21/563* (2013.01); *H01L 23/295* (2013.01); *C08J 2333/08* (2013.01); *C08K 2201/001* (2013.01); *H01L 2924/0002* (2013.01)

(58) Field of Classification Search
CPC ....... C09D 133/08; C08J 5/18; C08J 2333/08; H01L 23/295; H01L 21/563
USPC ......................................................... 524/404
See application file for complete search history.

(56) References Cited

U.S. PATENT DOCUMENTS

| | | | |
|---|---|---|---|
| 2008/0242058 A1 | 10/2008 | Ichikawa et al. | |
| 2009/0053518 A1* | 2/2009 | Saiki | C08L 63/00 |
| | | | 428/352 |
| 2013/0244402 A1 | 9/2013 | Tsuchiyama et al. | |

FOREIGN PATENT DOCUMENTS

| | | | |
|---|---|---|---|
| CN | 101275062 A | | 10/2008 |
| CN | 103305159 A | | 9/2013 |
| JP | 2004-214288 A | | 7/2004 |
| JP | 2004214288 A | * | 7/2004 |
| JP | 2012-33638 | | 2/2012 |
| WO | 2007/119507 A1 | | 10/2007 |

OTHER PUBLICATIONS

Translation of JP2004-214288, Jul. 29, 2004.*
International Search Report dated Jan. 20, 2015, in PCT/JP2014/079759 Filed Nov. 10, 2014.
Office Action dated Nov. 24, 2017, in Chinese Patent Application No. 201480060912.6, filed Nov. 10, 2014.

* cited by examiner

*Primary Examiner* — Hui Chin
(74) *Attorney, Agent, or Firm* — Oblon, McClelland, Maier & Neustadt, L.L.P.

(57) ABSTRACT

A composition for protective film formation capable of forming a protective film excellent in attachability by a tape mounter or the like, with good visibility at a laser-printed portion and heat dissipation properties, allowing a protective film-equipped chip having high reliability to be manufactured, and a sheet for protective film formation and a protective film-equipped chip are provided. The composition for protective film formation contains a polymer component (A), a curable component (B), and a heat conductive filler (C) having an average particle size of 2.0 to 10.0 μm. The content of components that are liquid at 25° C. contained in the composition for protective film formation is 20 to 70 parts by mass relative to 100 parts by mass of the total of the (A) component and the (B) component.

9 Claims, 1 Drawing Sheet

PROTECTIVE FILM FORMING COMPOSITION, PROTECTIVE FILM FORMING SHEET, AND CHIP PROVIDED WITH PROTECTIVE FILM

TECHNICAL FIELD

The present invention relates to a composition for protective film formation to form a protective film which protects the opposite surface of the circuit side of, for example, a semiconductor chip (the back surface of a chip), a sheet for protective film formation having a layer for protective film formation formed of the composition for protective film formation, and a protective film-equipped chip having a protective film formed by curing the protective film formation layer.

BACKGROUND ART

These days, the manufacturing of a semiconductor device using a mounting method of what is called the face-down system is performed. In the face-down system, a semiconductor chip (hereinafter, occasionally simply referred to as a "chip") having electrodes such as bumps on a circuit surface is used, and the electrodes are joined to a substrate. Hence, the surface on the opposite side to the circuit surface of the chip (chip back surface) is exposed.

In order to protect the exposed chip back surface, a protective film formed of organic material is disposed on the chip back surface in some cases, and the protective film-equipped chip having the chip back surface protected with the protective film may be directly incorporated into a semiconductor device in some cases.

With the densification of a semiconductor device installed with a semiconductor chip and the speeding-up of the manufacturing process of the semiconductor device in recent years, the heat generation from the semiconductor device is becoming a problem. There are cases where the heat generation of the semiconductor device causes a deformation, trouble, or breakage of the semiconductor device or causes a reduction in computing speed or a malfunction of the semiconductor device, and this leads to a reduction in the reliability of the semiconductor device. Thus, efficient heat dissipation properties are required for semiconductor chips incorporated into high performance semiconductor devices. Accordingly, the heat dissipation properties are required for the protective film of the protective film-equipped chip.

Since characters are printed on the surface of the protective film by laser marking in some cases, the protective film to be formed is required to have visibility of the laser printed portion.

In the case of a protective film-equipped semiconductor chip being incorporated into a semiconductor device, lifting-off, peeling-off, and cracks occur in the joint portion of the semiconductor chip with the protective film due to temperature change by the repetition of heat generation and cooling, resulting in a problem of reduction in the reliability of the protective film-equipped chip.

In order to form a protective film meeting the requirement, various materials for protective film formation have been proposed.

For example, Patent Document 1 discloses a film for the back surface of a flip chip type semiconductor, which contains a resin and a specific amount of heat conductive filler having an average particle size and a maximum particle size of specific values or less, respectively, in order to provide a film for the back surface of a semiconductor excellent in heat dissipation properties, with the visibility of the characters on the surface and the adhesion with a semiconductor wafer or the like being maintained.

CITATION LIST

Patent Literature

Patent Document 1: JP 2012-33638 A

SUMMARY OF INVENTION

Technical Problem

Incidentally, when a sheet or a film formed from material for protective film formation is attached to a wafer using a tape mounter or the like, the attachability by a tape mounter or the like comes to a problem in some cases due to occurrence of fracture of the material for protective film formation in a sheet or film form.

In Patent Document 1, no investigation is made on the attachability of the material for protective film formation in a sheet or film form, in the case of using such a tape mounter or the like.

According to the investigation by the present inventors, it was found that the film for the back surface of a semiconductor described in the example of Patent Document 1 has a problem in attachability by a tape mounter or the like, causing fracture of the film when attached using a tape mounter or the like.

An object of the present invention is to provide a composition for protective film formation capable of forming a protective film excellent in attachability by a tape mounter or the like, with good visibility at a laser-printed portion and heat dissipation properties, allowing a protective film-equipped chip having high reliability to be manufactured, and a sheet for protective film formation and a protective film-equipped chip.

Solution to Problem

The present inventors have found that a composition for protective film formation, wherein the content of components that are liquid at 25° C. contained in a curable component is controlled in a specified range, including a specified content of thermosetting filler with a specified average particle size, can solve the problem, and completed the present invention.

In other words, the present invention provides the following [1] to [13].

[1] A composition for protective film formation comprising a polymer component (A), a curable component (B), a heat conductive filler (C) having an average particle size of 2.0 to 10.0 µm, wherein the content of components that are liquid at 25° C. contained in the composition for protective film formation is 20 to 70 parts by mass relative to 100 parts by mass of the total of the (A) component and the (B) component, and the content of the (C) component is 40 to 65 volume % relative to the total amount of the composition for protective film formation.

[2] The composition for protective film formation according to [1] above, wherein the (C) component is a particle comprising one or more components selected from the group consisting of alumina, zinc oxide, magnesium oxide, titanium, silicon carbide, boron nitride, aluminum nitride, and glass.

[3] The composition for protective film formation according to [1] or [2] above, wherein the (C) component is a spherical heat conductive filler.

[4] The composition for protective film formation according to any one of [1] to [3] above, wherein the (A) component comprises an acrylic-based polymer (A1), the acrylic-based polymer (A1) being a copolymer having a constituent unit (a1) derived from an alkyl (meth)acrylate having an alkyl group with 1 to 18 carbon atoms and a constituent unit (a2) derived from a functional group-containing monomer.

[5] The composition for protective film formation according to any one of [1] to [4] above, wherein the content of the (A) component is 3 to 45 mass %, the content of the (B) component is 3 to 45 mass %, and the content of the (C) component is 35 to 90 mass %, relative to the total amount of effective components contained in the composition for protective film formation.

[6] The sheet for protective film formation having a protective film formation layer formed of the composition for protective film formation according to any one of [1] to [5] above.

[7] The sheet for protective film formation according to [6] above, wherein the protective film formed by curing the protective film formation layer has a thermal conductivity of 2.0 W/(m·K) or more.

[8] The sheet for protective film formation according to [6] or [7] above, wherein the protective film formed by curing the protective film formation layer has a gloss value of 10 or more.

[9] A protective film-equipped chip having, on the chip, a protective film formed by curing the protective film formation layer of the sheet for protective film formation according to any one of [6] to [8] above.

Advantageous Effects of Invention

The sheet for protective film formation having a protective film formation layer formed of the composition for protective film formation of the present invention achieves excellent attachability of the protective film formation layer by a tape mounter or the like, and the protective film formed by curing the protective film formation layer is excellent in visibility at a laser-printed portion and heat dissipation properties. Further, the protective film-equipped chip made from the sheet for protective film formation has high reliability.

DESCRIPTION OF EMBODIMENTS

Figure 1:
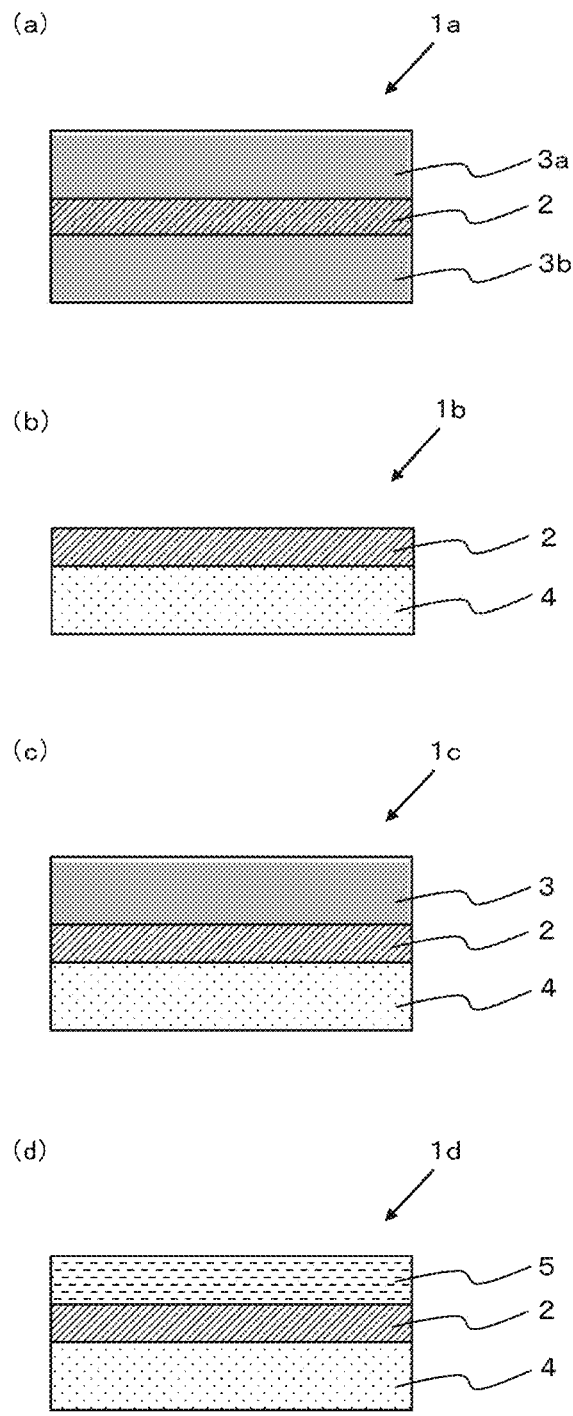
FIG. 1 is a cross-sectional view of the sheet for protective film formation showing an example of the configuration of the sheet for protective film formation of the present invention.

In the following description, the "mass average molecular weight (Mw)" and the "number average molecular weight (Mn)" are the values in polystyrene equivalent measured by the gel permeation chromatography (GPC) method, and are specifically the values measured on the basis of the method described in Examples.

Furthermore, for example, the "(meth)acrylate" is used as a term representing both "acrylate" and "methacrylate," and this applies also to other similar terms.

<Composition for Protective Film Formation>

The composition for protective film formation of the present invention contains a polymer component (A), a curable component (B), a heat conductive filler (C).

Preferably the composition for protective film formation of the present invention further contains a coloring agent (D) and a coupling agent (E), and may contain a general-purpose additive such as cross-linking agent as necessary.

In the case of using a composition for protective film formation blended with a large amount of heat conductive filler having a relatively small particle size in order to increase the heat conductivity of the protective film to be formed, the visibility of the protective layer at a laser printed portion is reduced in some cases.

In contrast, the composition for protective film formation of the present invention can have high visibility of the protective layer at a laser printed portion while maintaining the high heat conductivity of the protective layer to be formed, even blended with a large amount of heat conductive filler having a relatively small particle size, due to control of the content of components that are liquid at 25° C. in a specified range.

In the composition for protective film formation of the present invention, the content of components that are liquid at 25° C. is 20 to 70 parts by mass, preferably 23 to 65 parts by mass, more preferably 25 to 60 parts by mass, still more preferably 28 to 55 parts by mass, and yet still more preferably 30 to 50 parts by mass relative to 100 parts by mass of the total of the (A) component and the (B) component.

With the content of less than 20 parts by mass, the composition for protective film formation having a large content of the composition (C) as in the present invention allows the initial attachability of the protective film formation layer formed of the composition to decrease. The visibility of the protective film formed by curing the protective film formation layer at a laser printed portion is also worsened. It is noted that the visibility of the protective film to be formed at a laser printed portion is more improved as the content increases.

Meanwhile, with the content of more than 70 parts by mass, the protective film formation layer to be formed from the composition for protective film formation has poor attachability by a tape mounter or the like, easily causing fracture when attached by a tape mounter or the like. Further, in the case of a sheet made to have a sheet structure for protective film formation sheet 1a as shown in FIG. 1 (a), for example, a protective film formation layer 2 is peeled off together with a release sheet 3a, not remaining on another release sheet 3b, in some cases when the release sheet 3a is removed, causing a problem also in the workability of attachment.

In the present invention, the term "liquid components that are liquid at 25° C." means components having a viscosity at 25° C. of 50 Pa·s or less as measured by a B type viscometer.

Examples of "the components that are liquid at 25° C. contained in a composition for protective film formation" include a liquid curable component contained as the (B) component, a liquid coupling agent contained as the (E) component, and a liquid general-purpose additive.

The content of the liquid curable component contained as the (B) component relative to the total amount of the components that are liquid at 25° C. contained in a composition for protective film formation is preferably 50 to 100 mass %, more preferably 70 to 100 mass %, still more preferably 80 to 100 mass %, and yet still more preferably 90 to 100 mass %.

Each component contained in the composition for protective film formation of the present invention will now be described.

<(A) Component: Polymer Component>

The polymer component as the (A) component is used to impart flexibility and film formability to a protective film formation layer formed of the composition for protective film formation of the present invention, and to improve maintainability of the sheet characteristics of the protective film formation layer. Accordingly, the (A) component contained in the composition for protective film formation of the present invention contributes the improvement in attachability of the protective film formation layer to be formed of the composition for protective film formation of the present invention by a tape mounter or the like.

Herein, "the polymer component" of the (A) component means a compound having a mass average molecular weight (Mw) of 20,000 or more, with at least one repeating unit.

The (A) component has a mass average molecular weight (Mw) of typically 20,000 or more, preferably 20,000 to 3,000,000, more preferably 50,000 to 2,000,000, and still more preferably 100,000 to 1,500,000.

The content of the (A) component relative to the total amount of the composition for protective film formation is preferably 3 to 45 mass %, more preferably 4 to 40 mass %, still more preferably 5 to 35 mass %, and yet still more preferably 7 to 30 mass %.

With the content of the (A) component of 3 mass % or more, the protective film formation layer to be formed of the composition for protective film formation can be imparted with flexibility and film formability, having improved attachability by a tape mounter or the like. On the other hand, with the content of the (A) component of 45 mass % or less, a sufficient content of the (C) component can be secured, so that the good heat dissipation properties of the protective layer to be formed of the composition for protective film formation can be obtained.

The (A) component may be appropriately selected, preferably containing an acrylic-based polymer (A1), and may contain a non-acrylic-based polymer (A2) other than the acrylic-based polymer (A1).

These polymer components may be used singly or in combinations of two or more.

The content of the acrylic-based polymer (A1) relative to the total amount of the (A) component is preferably 60 to 100 mass %, more preferably 70 to 100 mass %, and still more preferably 80 to 100 mass %.

[(A1) Component: Acrylic-Based Polymer]

The mass average molecular weight (Mw) of the acrylic-based polymer (A1) is preferably 20 thousand to 3 million, more preferably 100 thousand to 1.5 million, still more preferably 150 thousand to 1.2 million, and yet still more preferably 250 thousand to 1.0 million from the viewpoint of providing flexibility and film formability to the film for protective film formation layer formed of the composition for protective film formation.

The glass transition temperature (Tg) of the acrylic-based polymer (A1) is preferably −60 to 50° C., more preferably −50 to 40° C., still more preferably −40 to 30° C., and yet still more preferably −35 to 20° C., from the viewpoint of adhesion of a protective film to be formed of the composition for protective film formation to an adherend such as wafer, and the viewpoint of improvement in the reliability of the protective film-equipped chip to be obtained.

In the case of the acrylic-based polymer (A1) including a plurality of acrylic-based polymers, the weighted average of the glass transition temperature of individual acrylic-based polymers is defined as the glass transition temperature of the acrylic-based polymer (A1).

In the present invention, the glass transition temperature (Tg) of the acrylic-based polymer (A1) is the value converted to the Celsius temperature (unit: ° C.) scale of the glass transition temperature (TgK) on the absolute temperature (unit: K) scale calculated by Formula (1) below.

$$\frac{100}{Tg_K} = \frac{W_1}{Tg_1} + \frac{W_2}{Tg_2} + \frac{W_3}{Tg_3} + \frac{W_4}{Tg_4} + \ldots \quad (1)$$

wherein $W_1$, $W_2$, $W_3$, $W_4$, ... represent the mass fraction (mass %) of the monomer component constituting the acrylic-based polymer and $Tg_1$, $Tg_2$, $Tg_3$, $Tg_4$, ... represent the glass transition temperature expressed on the absolute temperature (K) scale of the homopolymer of the monomer component of the acrylic-based polymer.

As the acrylic-based polymer (A1), a polymer containing an alkyl (meth)acrylate as a main component is given.

Among these, an acrylic-based polymer containing a constituent unit (a1) derived from an alkyl (meth)acrylate (hereinafter also referred to as "monomer (a1)") having an alkyl group with 1 to 18 carbon atoms is preferable, and an acrylic-based copolymer containing a constituent unit (a2) derived from a functional group-containing monomer (hereinafter also referred to as "monomer (a2)") along with the constituent unit (a1) is more preferable.

The acrylic-based polymer (A1) may be used singly or in combinations of two or more.

In the case where the acrylic-based polymer (A1) is a copolymer, the form of the copolymer may be any of a block copolymer, a random copolymer, an alternating copolymer, and a graft copolymer.

(Monomer (a1))

The number of carbons of the alkyl group which the monomer (a1) has is preferably 1 to 18, more preferably 1 to 12, still more preferably 1 to 8, and yet still more preferably 1 to 4, from the viewpoint of imparting flexibility and film formability to the protective film formation layer to be formed of the composition for protective film formation.

As the monomer (a1), for example, methyl (meth)acrylate, ethyl (meth)acrylate, propyl (meth)acrylate, butyl (meth)acrylate, pentyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, lauryl (meth)acrylate, stearyl (meth)acrylate, and the like are given.

These monomers (a1) may be used singly or in combinations of two or more.

Among the monomers (a1) described above, preferably an alkyl (meth)acrylate having an alkyl group with 4 or more carbon atoms is used, more preferably an alkyl (meth)acrylate having an alkyl group with 4 to 6 carbon atoms is used, and still more preferably butyl(meth)acrylate is used, from the viewpoints of increasing the gloss value of the protective film to be formed of the composition for protective film formation and improving the visibility of the protective film at the laser printed portion.

From the viewpoint described above, the content of the constituent unit derived from the alkyl (meth)acrylate having an alkyl group with 4 or more carbon atoms relative to the total constituent units of the acrylic-based polymer (A1)

is preferably 1 to 75 mass %, more preferably 5 to 70 mass %, still more preferably 10 to 65 mass %, and yet still more preferably 20 to 60 mass %.

Among the monomers (a1), preferably an alkyl (meth) acrylate having an alkyl group with 1 to 3 carbon atoms is used, and more preferably methyl (meth)acrylate is used, from the viewpoint of improving the reliability of the protective-film equipped chip made from the composition for protective film formation.

From the viewpoint described above, the content of the constituent unit derived from an alkyl (meth)acrylate having an alkyl group with 1 to 3 carbon atoms relative to the total constituent units of the acrylic-based polymer (A1) is preferably 1 to 60 mass %, more preferably 3 to 50 mass %, still more preferably 5 to 40 mass %, and yet still more preferably 7 to 30 mass %.

The content of the constituent unit (a1) derived from the monomer (a1) relative to the total constituent units of the acrylic-based polymer (A1) is preferably 50 mass % or more, more preferably 50 to 99 mass %, still more preferably 55 to 90 mass %, and yet still more preferably 60 to 80 mass %.

(Monomer (a2))

As the monomer (a2), for example, a hydroxy group-containing monomer, an epoxy group-containing monomer, a carboxy group-containing monomer, an amino group-containing monomer, a cyano group-containing monomer, a keto group-containing monomer, a monomer having a nitrogen atom-containing ring, an alkoxysilyl group-containing monomer, and the like are given.

These monomers (a1) may be used singly or in combinations of two or more.

Among the monomers (a1), a hydroxy group-containing monomer, an epoxy group-containing monomer, and a carboxy group-containing monomer are preferable.

As the hydroxy-containing monomer, for example, hydroxyalkyl (meth)acrylates such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth) acrylate; unsaturated alcohols such as vinyl alcohol and allyl alcohol; and the like are given.

Of these, 2-hydroxyethyl (meth)acrylate is preferable.

Examples of the epoxy group-containing monomer include an epoxy group-containing (meth)acrylic acid ester such as glycidyl (meth)acrylate, β-methylglycidyl (meth) acrylate, (3,4-epoxycyclohexyl)methyl (meth)acrylate, 3-epoxycyclo-2-hydroxypropyl (meth)acrylate; and a non-acrylic-based epoxy group-containing monomer such as glycidyl crotonate and allyl glycidyl ether.

Among them, an epoxy group-containing (meth)acrylic acid ester is preferable, and glycidyl (meth)acrylate is more preferable.

By a constituent unit derived from an epoxy group-containing monomer being contained in the constituent units of the acrylic-based polymer (A1), the gloss value of a protective film formed of the composition for protective film formation can be increased and the visibility of the protective film at a laser printed portion can be improved.

The content of the constituent unit derived from an epoxy group-containing monomer relative to the total of constituent units of the acrylic-based polymer (A1) is preferably 1 to 30 mass %, more preferably 5 to 27 mass %, and still more preferably 10 to 24 mass %.

With the content of 1 mass % or more, the gloss value of the protective film to be formed of the composition for protective film formation can be increased, and the visibility of the protective film at a laser printed portion can be improved. Meanwhile, with the content of 30 mass % or less, the reliability of a protective film-equipped chip made from the composition for protective film formation can be enhanced.

Examples of the carboxy group-containing monomer include (meth)acrylic acid, maleic acid, fumaric acid, and itaconic acid.

By using a carboxy group-containing monomer, a carboxy group is introduced into the acrylic-based polymer (A1); and when an energy beam curable component is contained as the curable component (B), the compatibility between the (B) component and the (A) component can be improved.

In the case where an epoxy-based thermosetting component is used as the curable component (B), the carboxyl group and the epoxy group in the epoxy-based thermosetting component react together; thus, the content of the structural units derived from carboxyl group-containing monomers is preferably small.

In the case where an epoxy-based thermosetting component is used as the curable component (B), the content of the structural units derived from carboxyl group-containing monomers is preferably 0 to 10 mass %, more preferably 0 to 5 mass %, still more preferably 0 to 2 mass %, and yet still more preferably 0 mass % relative to the total constituent units of the acrylic-based polymer (A1).

The content of the constituent unit (a2) derived from the monomer (a2) is preferably 1 to 50 mass %, more preferably 5 to 45 mass %, still more preferably 10 to 40 mass %, and yet still more preferably 20 to 40 mass % relative to the total constituent units of the acrylic-based polymer (A1).

(Other Monomer)

The acrylic-based polymer (A1) used in the present invention may contain a constituent unit derived from another monomer other than the monomers (a1) and (a2) mentioned above to the extent that the effect of the present invention is not impaired.

As the other monomer, for example, vinyl acetate, styrene, ethylene, an α-olefin, and the like are given.

[(A2) Component: Non-Acrylic-Based Resin (A2)] The composition for protective film formation of the present invention may contain, a non-acrylic-based resin (A2) as a resin component other than the (A1) acrylic-based polymer described above.

As the non-acrylic-based resin (A2), for example, a polyester, a phenoxy resin, a polycarbonate, a polyether, a polyurethane, a polysiloxane, a rubber-based resin, and the like are given.

These resins may be used singly or in combinations of two or more.

The mass average molecular weight of the non-acrylic-based resin (A2) is preferably 20 thousand or more, more preferably 20 to 100 thousand, and still more preferably 20 to 80 thousand.

<(B) Component: Curable Component>

The curable component as the (B) component is a component which plays a role to form a hard protective film by curing of the protective film formation layer formed of the composition for protective film formation of the present invention, referring to a compound having a mass average molecular weight (Mw) of less than 20,000.

Preferably, at least one of a thermosetting component (B1) and an energy beam curable component (B2) is used as the (B) component, and more preferably, at least a thermosetting component (B1) is used from the viewpoints of suppressed coloring of the protective film to be formed, sufficient progress of the curing reaction, and cost reduction.

The thermosetting component (B1) preferably contains at least a compound having a functional group reactive by heat, more preferably contains an epoxy group-containing compound (B11) (hereinafter also referred to as "epoxy-based compound (B11)"), and still more preferably further contains a thermosetting agent (B12) and/or a curing catalyst (B13).

The energy beam curable component (B2) preferably contains a compound (B21) having a functional group reactive by irradiation of an energy beam such as UV light and an electron beam (hereinafter also referred to as "energy beam reactive compound (B21)", and more preferably further contains a photopolymerization initiator (B22).

In the present invention, the thermosetting component (B1) such as the epoxy compound (B11), the thermosetting agent (B12), and the curing catalyst (B13) and the energy beam curable component (B2) such as the energy beam reactive compound (B21) and the photopolymerization initiator (B22) are contained in the (B) component. The (B) component contained in the composition for protective film formation of the present invention may contain one or more selected from the group consisting of the components (B11) to (B13) and (B21) to (B22), and may contain a curable component other than the components mentioned above.

The content of the (B) component relative to the total amount of the composition for protective film formation is preferably 3 to 45 mass %, more preferably 4 to 40 mass %, still more preferably 5 to 35 mass %, and yet still more preferably 6 to 30 mass %.

(Epoxy-Based Compound (B11))

As the epoxy-based compound (B11), for example, an epoxy-based compound having two or more functions in a molecule such as a polyfunctional epoxy resin, bisphenol A diglycidyl ether and a hydrogenated substance thereof, an orthocresol novolac epoxy resin, a dicyclopentadiene-type epoxy resin, a biphenyl-type epoxy resin, a bisphenol A-type epoxy resin, a bisphenol F-type epoxy resin, and a phenylene skeleton-type epoxy resin and the like are given.

These epoxy-based compounds (B11) may be used singly or in combinations of two or more.

Among them, a bisphenol A-type epoxy resin and a dicyclopentadiene-type epoxy resin are preferable.

The epoxy equivalent of the epoxy-based compound (B11) is preferably 70 to 700, more preferably 100 to 500, still more preferably 130 to 400, and yet still more preferably 150 to 300.

The mass average molecular weight (Mw) of the epoxy-based compound (B11) is typically less than 20,000, preferably 10,000 or less, and more preferably 100 to 10,000, from the viewpoint of improving the handling properties with suppressed increase in viscosity of the composition for protective film formation to be obtained.

The content of the epoxy compound (B11) is preferably 1 to 500 parts by mass, more preferably 10 to 350 parts by mass, still more preferably 30 to 200 parts by mass, and yet still more preferably 50 to 140 parts by mass relative to 100 parts by mass of the (A) component.

(Thermosetting Agent (B12))

The thermosetting agent (B12) functions as a curing agent to the epoxy compound (B11).

As the thermosetting agent (B12), a compound having two or more functional groups capable of reacting with an epoxy group in one molecule is preferable.

As the functional group, a phenol-type hydroxyl group, an alcohol-type hydroxyl group, an amino group, a carboxyl group, an acid anhydride, and the like are given.

Of these, a phenol-type hydroxyl group or an amino group is preferable, and an amino group is more preferable.

As the phenol-based thermosetting agent having a phenol group hydroxyl group, for example, a polyfunctional phenol resin, a biphenol resin, a novolac-type phenol resin, a dicyclopentadiene-based phenol resin, a Xylok-type phenol resin, an aralkyl phenol resin, and the like are given.

As the amine-based thermosetting agent having an amino group, for example, dicyandiamide (DICY) and the like are given.

These thermosetting agents (B12) may be used singly or in combinations of two or more.

The molecular weight (formula weight) of the thermosetting agent (B12) (mass average molecular weight (Mw) in the case of the thermosetting agent (B12) being a polymer) is preferably 70 to 10,000, more preferably 80 to 5,000.

The content of the thermosetting agent (B12) is preferably 0.1 to 500 parts by mass, more preferably 1 to 200 parts by mass, and still more preferably 2 to 100 parts by mass relative to 100 parts by mass of the epoxy-based compound (B11).

(Curing Catalyst (B13))

The curing catalyst (B13) is used to control the curing rate of the protective film formation layer formed of the composition for protective film formation.

The curing catalyst (B13) is preferably used as the thermosetting component (B1) in combination with the epoxy-based compound (B11).

As the curing catalyst (B13), for example, tertiary amines such as triethylenediamine, benzyldimethylamine, triethanolamine, dimethylaminoethanol, and tris(dimethylaminomethyl)phenol; imidazoles such as 2-methylimidazole, 2-phenylimidazole, 2-phenyl-4-methylimidazole, 2-phenyl-4,5-dihydroxymethylimidazole, and 2-phenyl-4-methyl-5-hydroxymethylimidazole; organic phosphines such as tributylphosphine, diphenylphosphine, and triphenylphosphine; tetraphenylborates such as tetraphenylphosphonium tetraphenylborate and triphenylphosphine tetraphenylborate; and the like are given.

These curing catalysts (B13) may be used singly or in combinations of two or more.

The molecular weight (formula weight) of the curing catalyst (B13) (mass average molecular weight (Mw) in the case of the curing catalyst (B13) being a polymer) is preferably 100 to 10,000, more preferably 150 to 5,000.

The content of the curing catalyst (B13) is preferably 0.01 to 20 parts by mass, more preferably 0.1 to 10 parts by mass, and still more preferably 0.3 to 6 parts by mass relative to 100 parts by mass of the total amount of the epoxy-based compound (B11) and the thermosetting agent (B12) from the viewpoints of improvement in the adhesiveness of the protective film formed of the obtained composition for protective film formation and improvement in the reliability of the protective film-equipped chip.

(Energy Beam Reactive Compound (B21))

As the energy beam reactive compound (B21), for example, trimethylolpropane triacrylate, pentaerythritol triacrylate, pentaerythritol tetraacrylate, dipentaerythritol monohydroxy pentaacrylate, dipentaerythritol hexaacrylate, 1,4-butylene glycol diacrylate, 1,6-hexanediol diacrylate, an oligoester acrylate, an urethane acrylate-based oligomer, an epoxy acrylate, a polyether acrylate, an itaconic acid oligomer, and the like are given.

These energy beam reactive compounds (B21) may be used singly or in combinations of two or more.

The molecular weight (formula weight) of the energy beam reactive compound (B21) (mass average molecular weight (Mw) in the case of the energy beam reactive compound (B21) being a polymer) is preferably 100 to 10,000, more preferably 300 to 10,000.

The content of the energy beam reactive compound (B21) is preferably 1 to 1500 parts by mass and more preferably 3 to 1200 parts by mass relative to 100 parts by mass of the (A) component.

(Photopolymerization Initiator (B22))

By using the energy beam reactive compound (B21) described above in combination with a photopolymerization initiator (B22), the polymerization curing time can be shortened, and the curing of the protective film formation layer formed of composition for protective film formation can be advanced even when the amount of beam irradiation is small.

Examples of the photopolymerization initiator (B22) include a photoinitiator such as a benzoin compound, an acetophenone compound, an acyl phosphine oxide compound, a titanocene compound, a thioxanthone compound, and a peroxide compound, and a photosensitizer such as an amine and a quinone. Specific examples thereof include 1-hydroxycyclohexyl phenyl ketone, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl, β-chloroanthraquinone, and 2,4,6-trimethylbenzoyldiphenylphosphine oxide.

These photopolymerization initiators (B22) may be used singly or in combinations of two or more.

The molecular weight (formula weight) of the photopolymerization initiator (B22) (mass average molecular weight (Mw) in the case of the photopolymerization initiator (B22) being a polymer) is preferably 70 to 10,000, more preferably 80 to 5,000.

The content of the photopolymerization initiator (B22) is preferably 0.1 to 10 parts by mass and more preferably 1 to 5 parts by mass relative to 100 parts by mass of the energy beam reactive compound (B21) from the viewpoints of advancing the curing reaction sufficiently and suppressing the production of residues.

<(C) Component: Heat Conductive Filler>

The composition for protective film formation of the present invention contains a heat conductive filler (C) having an average particle size of 2.0 to 10.0 μm.

By the heat conductive filler (C) being contained in the composition for protective film formation of the present invention, the thermal conductivity of the protective film formed of the composition for protective film formation can be increased and the heat dissipation properties of the protective film can be improved. As a result, the heat generated from a semiconductor device mounted with a protective film-equipped semiconductor chip produced by using the composition for the protective film formation can be diffused efficiently.

The average particle size of the (C) component is 2.0 to 10.0 μm, preferably 2.2 to 7.5 μm, more preferably 2.4 to 6.5 μm, still more preferably 2.5 to 5.5 μm, and yet still more preferably 2.6 to 4.8 μm.

With the average particle size of the (C) component of less than 2.0 μm, the initial attachability of the protective film formation layer formed of the composition for protective film formation to an adherent such as wafer is markedly reduced. Further, since the specific surface area of a particle of the (C) component increases, the heat loss resulting from the increase of the contact area between the (A) component and the (C) component in the protective film to be formed increases, so that the heat conductivity of the protective film is reduced.

Meanwhile, with the average particle size of the (C) component of more than 10.0 μm, the coating properties of the composition for protective film formation to be obtained is worsened, so that the formation of a thin coating film becomes difficult. Further, since the surface roughness of the protective film to be formed of the composition for protective film formation increases, the visibility of the protective film at a laser printed portion is worsened. Furthermore, the thermal conductivity of the protective film tends to decrease.

In the present invention, the average particle size means a value measured by the method described in Examples.

The (C) component preferably includes particles formed of one or more components selected from the group consisting of alumina, zinc oxide, magnesium oxide, titanium, silicon carbide, boron nitride, aluminum nitride and glass. Since these components have a relatively high thermal conductivity, the thermal conductivity of the protective film to be formed of the composition for protective film formation containing the particles formed of these components is effectively increased, so that the heat dissipation properties of the protective film can be effectively improved.

Examples of the glass include a non-alkali glass containing 0.1 mass % or less of alkali components. Specific examples thereof include a non-alkali glass containing 40 to 70 mass % of $SiO_2$, 6 to 25 mass % of $Al_2O_3$, 5 to 20 mass % of $B_2O_3$, 0 to 10 mass % of MgO, 0 to 15 mass % of CaO, 0 to 30 mass % of BaO, 0 to 10 mass % of SrO, 0 to 10 mass % of ZnO, and 0 to 5 mass % of a refining agent.

The (C) component may particles of one type selected from these, or may be particles of two or more types in combination.

Among these, from the viewpoint of the above, particles of alumina or particles of silicon carbide are preferable, and particles of alumina are more preferable.

The (C) component may be used singly or in combinations of two or more.

Examples of the shape of the (C) component include a spherical form, a plate-like form, and a fiber form. From the viewpoints of improving the visibility of the protective film to be formed of the composition for protective film formation at a laser printed portion, and improving the adhesion of the protective film, a spherical heat conductive filler is preferable.

In the case of the (C) component being a spherical heat conductive filler, the aspect ratio of the spherical heat conductive filler [(major axis number average size)/(minor axis number average size)] is preferably 1.0 to 1.3, more preferably 1.0 to 1.2.

The thermal conductivity of the (C) component is preferably 10 W/(m·K) or more, more preferably 20 W/(m·K) or more, and still more preferably 30 W/(m·K) or more.

The density of the (C) component is preferably 1.5 to 6.0 g/cm$^3$, more preferably 2.0 to 5.0 g/cm$^3$, and still more preferably 2.2 to 4.5 g/cm$^3$.

The content of the component (C) (volume ratio) relative to the total amount (total volume) of the composition for protective film formation of the present invention is 40 to 65 volume %, preferably 43 to 63 volume %, more preferably 45 to 61 volume %, still more preferably 48 to 59 volume %, and yet still more preferably 52 to 59 volume %.

With the content (volume ratio) of the (C) component of less than 40 volume %, the thermal conductivity of the protective film to be formed of the composition for protective film formation is not sufficiently increased, so that the heat dissipation properties of the protective film is worsened.

Meanwhile, with the content (volume ratio) of the (C) component of more than 65 volume %, the protective film to be formed of the composition for protective film formation is fractured during attachment with use of a tape mounter or the like, having worsened attachability by a tape mounter or the like. Further, the initial attachability of the protective film formation layer may possibly decrease.

The content (mass ratio) of the (C) component relative to the total amount (total mass) of the composition for protective film formation of the present invention is preferably 35 to 90 mass %, more preferably 50 to 88 mass %, still more preferably 65 to 87 mass %, and yet still more preferably 70 to 85 mass %, from the viewpoints of improving the thermal conductivity of the protective film to be formed of the composition for protective film formation and improving the attachability of the protective film formation layer formed of the composition for protective film formation by a tape mounter or the like.

<(D) Component: Coloring Agent>

The composition for protective film formation of the present invention preferably further contains a coloring agent (D).

By the coloring agent (D) being contained, when a protective film-equipped chip formed of the composition for protective film formation is incorporated into an apparatus, infrared light etc. generated from the surrounding apparatus can be blocked and the malfunction of the chip can be prevented. Furthermore, when a product number or a mark is printed by laser marking or the like, the difference in contrast between a laser printed portion and a non-printed portion is increased, so that the distinctive character of the laser printed portion of the protective film can be improved.

As the (D) component, a dye or pigment which contains an organic material or an inorganic material can be used.

Example of the dye include an acid dye, a reactive dye, a direct dye, a disperse dye, a cationic dye, and the like, without particular limitations.

The pigment is not particularly limited, and known pigments may be appropriately selected for use.

Of these, a black pigment is preferable from the viewpoints of the property of blocking electromagnetic waves and infrared light being good and improving distinguishability of the protective film to be formed by the laser marking method more.

As the black pigment, for example, carbon black, iron oxide, manganese dioxide, aniline black, activated carbon, and the like are given, and carbon black is preferable from the viewpoint of enhancing the reliability of the protective film-equipped semiconductor chip.

These (D) components may be used singly or in combinations of two or more.

The average particle size of the (D) component is preferably 1 to 200 nm, more preferably 5 to 100 nm, and still more preferably 10 to 50 nm.

The content of the (D) component is preferably 0.1 to 30 mass %, more preferably 0.5 to 25 mass %, still more preferably 1.0 to 20 mass %, and yet still more preferably 1.5 to 15 mass % relative to the total amount of the composition for protective film formation.

<(E) Component: Coupling Agent>

The composition for protective film formation of the present invention preferably contains a coupling agent (E).

By the coupling agent (E) being contained, the surfaces of the (A) component and an adherend such as wafer, or the surfaces of the (A) component and the (C) component are bonded through the (E) component in the protective film formed of the composition for protective film formation to be obtained, so that the adhesiveness and cohesiveness can be improved. Furthermore, water resistance can be improved without impairing the heat resistance of the protective film to be formed.

As the (E) component, a compound that reacts with a functional group that the (A) component or the (B) component has is preferable, and a silane coupling agent is more preferable.

As the silane coupling agent, for example, γ-glycidoxypropyltrimethoxysilane, γ-glycidoxypropylmethyldiethoxysilane, β-(3,4-epoxycyclohexyl)ethyltrimethoxysilane, γ-(methacryloxypropyl)trimethoxysilane, γ-aminopropyltrimethoxysilane, N-6-(aminoethyl)-γ-aminopropyltrimethoxysilane, N-6-(aminoethyl)-γ-aminopropylmethyldiethoxysilane, N-phenyl-γ-aminopropyltrimethoxysilane, γ-ureidopropyltriethoxysilane, γ-mercaptopropyltrimethoxysilane, γ-mercaptopropylmethyldimethoxysilane, bis(3-triethoxysilylpropyl)tetrasulfane, methyltrimethoxysilane, methyltriethoxysilane, vinyltrimethoxysilane, vinyltriacetoxysilane, imidazole silane, and the like are given.

The (E) component may be used singly or in combinations of two or more.

As the (E) component, an oligomer-type coupling agent is preferable.

The number average molecular weight (Mn) of the (E) component including oligomer-type coupling agents is preferably 100 to 15000, more preferably 150 to 10000, still more preferably 200 to 5000, and yet still more preferably 350 to 2000.

The content of the (E) component is preferably 0.01 to 20 mass %, more preferably 0.05 to 10 mass %, still more preferably 0.10 to 7 mass %, and yet still more preferably 0.15 to 4 mass % relative to the total amount of the composition for protective film formation.

<Other Additive>

The composition for protective film formation of the present invention may contain other additives other than the (A) to (E) components within a range not to impair the effect of the present invention, as necessary.

Examples of the other additives include a cross-linking agent, a leveling agent, a plasticizer, an antistatic agent, an antioxidant, an ion scavenger, a gettering agent, and a chain transfer agent.

The content of each of these additives is appropriately adjusted to the extent that the effect of the present invention is not impaired, and is preferably 0 to 10 mass %, more preferably 0 to 5 mass % or less, and still more preferably 0 to 3 mass % relative to the total amount of the composition for protective film formation.

[Sheet for Protective Film Formation]

The sheet for protective film formation of the present invention is not particularly limited as long as having a protective film formation layer formed of the composition for protective film formation described above. FIG. 1 is a cross-sectional view of the sheet for protective film formation showing an example of the configuration of the sheet for protective film formation of the present invention.

Examples of the configuration of the sheet for protective film formation of the present invention include a sheet for protective film formation 1a including a protective film formation layer 2 held between two release sheets 3a and 3b as shown in FIG. 1 (a), and a sheet for protective film formation 1b including a protective film formation layer 2 stacked on a support sheet 4 as shown in FIG. 1 (b). The sheet for protective film formation 1b may have a configuration as in a sheet for protective film formation 1c further having a release sheet 3 stacked on the protective film formation layer 2 as shown in FIG. 1 (c).

Alternatively, examples of the configuration may include a sheet for protective film formation 1d further having a pressure sensitive adhesive layer 5 as shown in FIG. 1 (d). Although the sheet for protective film formation 1d in FIG. 1 (d) has the pressure sensitive adhesive layer 5 disposed on the protective film formation layer 2, the pressure sensitive adhesive layer 5 may be disposed on the surface of the support sheet 4 and/or the protective film formation layer 2.

Examples of the pressure sensitive adhesive to constitute the pressure sensitive adhesive layer include a rubber-based pressure sensitive adhesive, an acrylic-based pressure sensitive adhesive, a silicone-based pressure sensitive adhesive, a polyvinyl ether-based pressure sensitive adhesive, an energy beam curable-type pressure sensitive adhesive curable by irradiation of an energy beam to have re-releasability, a heat-foamable-type pressure sensitive adhesive, and a water-swelling-type pressure sensitive adhesive.

Among them, an energy beam curable-type pressure sensitive adhesive is preferable.

The thickness of the pressure sensitive adhesive layer may be appropriately adjusted, being preferably 5 to 200 µm, more preferably 7 to 150 µm, and still more preferably 10 to 100 µm.

Examples of the support sheet for use in the a sheet for protective film formation include a film such as a polyethylene film, a polypropylene film, a polybutene film, a polybutadiene film, a polymethylpentene film, a polyvinyl chloride film, a vinyl chloride copolymer film, a polyethylene terephthalate film, a polyethylene naphthalate film, a polybutylene terephthalate film, a polyurethane film, an ethylene-vinyl acetate copolymer film, an ionomer resin film, an ethylene-(meth)acrylic acid copolymer film, an ethylene-(meth)acrylic acid ester copolymer film, a polystyrene film, a polycarbonate film, a polyimide film, and a fluorine resin film. The cross-linked films of these may be used. A stacked film with two or more of these films stacked may be used.

A colored film may be used as the support sheet.

Examples of the release sheet for use in the sheet for protective film formation include a sheet with a release treatment on the support sheet.

Examples of the releasing agent for use in the release treatment include an alkyd-based releasing agent, a silicone-based releasing agent, a fluorine-based releasing agent, an unsaturated polyester-based releasing agent, a polyolefin-based releasing agent, and wax-based releasing agent. From the viewpoint of heat resistance, an alkyd-based releasing agent, a silicone-based releasing agent, and a fluorine-based releasing agent are preferable.

The thickness of the support sheet and the release sheet is preferably 10 to 500 µm, more preferably 15 to 300 µm, and still more preferably 20 to 200 µm.

The thickness of the protective film formation layer is preferably 10 to 70 µm, more preferably 15 to 50 µm, and still more preferably 20 to 45 µm.

The gloss value of the protective film formed by curing the protective film formation layer is preferably 10 or more, more preferably 12 or more, still more preferably 16 or more, and yet still more preferably 20 or more, from the viewpoint of improving the visibility of the protective film at the laser printed portion.

The thermal conductivity of the protective film formed by curing the protective film formation layer is preferably 2.0 W/(m·K) or more, more preferably 2.3 W/(m·K) or more, still more preferably 2.5 W/(m·K) or more, and yet still more preferably 2.8 W/(m·K) or more.

The gloss value and the thermal conductivity of the protective film are values measured by the methods described in Examples.

[Method for Manufacturing the Sheet for Protective Film Formation]

There are no particular limitations on the method for manufacturing the sheet for protective film formation of the present invention, and the sheet can be manufactured by a known method. For example, the method for manufacturing the sheet for protective film formation may include adding an organic solvent to the composition for protective film formation to form a solution of the composition for protective film formation, applying the solution of the composition for protective film formation to a support sheet or a release sheet by a known coating method to form a coating film, and drying the film to form the protective film formation layer As the organic solvent used, toluene, ethyl acetate, methyl ethyl ketone, and the like are given.

The solid content concentration of the solution of the composition for protective film formation when an organic solvent is blended is preferably 10 to 80 mass %, more preferably 20 to 70 mass %, and still more preferably 30 to 65 mass %.

As the coating method, for example, the spin coating method, the spray coating method, the bar coating method, the knife coating method, the roll coating method, the roll knife coating method, the blade coating method, the die coating method, the gravure coating method, and the like are given.

[Protective Film-Equipped Chip]

The composition for protective film formation and the sheet for protective film formation of the present invention can be used as a material for protective film formation for protection of the back surface of a semiconductor chip.

The protective film-equipped chip of the present invention has a protective film, on the surface of a semiconductor chip, cured by applying heat and/or light to the protective film formation layer formed of the composition for protective film formation of the present invention.

In the protective film, at least a portion of the protective film formation layer is required to be cured, and preferably the protective film formation layer is completely cured.

The protective film-equipped chip of the present invention has a protective film formed by curing the protective film formation layer formed of the composition for protective film formation of the present invention. Since the protective film has high thermal conductivity, occurrence of lifting-off, peeling-off, or cracks in the joint portion of the chip with the protective film caused by temperature change can be suppressed. Consequently, the protective film-equipped semiconductor chip has excellent reliability.

A semiconductor device can be manufactured by mounting the protective film-equipped chip on a substrate or the like by the face-down system. A semiconductor device can be manufactured also by attaching the protective film-equipped chip onto a die pad unit or another member such as another semiconductor chip (onto a chip mounting portion).

[Method for Manufacturing the Protective Film-Equipped Chip]

Examples of the manufacturing method of the protective film-equipped chip of the present invention include the following method, though not particularly limited.

First, the protective film formation layer of the sheet for protective film formation of the present invention is stacked on the back surface of a semiconductor wafer. In the case of the sheet for protective film formation having a support sheet or a release sheet, the support sheet or the release sheet is then released, and the protective film formation layer stacked on the semiconductor wafer is heat-cured and/or light-cured to form a protective film formed by curing the protective film formation layer on the whole surface of the wafer.

In the protective film to be formed, at least a portion of the protective film formation layer is required to be cured, and preferably the protective film formation layer is completely cured.

Here, the semiconductor wafer may be a silicon wafer, or may be a compound semiconductor wafer of gallium, arsenide or the like. The semiconductor wafer has the surface with a circuit formed thereon and a back surface appropriately ground to have a thickness of typically 50 to 500 μm.

Subsequently, the laminate of the semiconductor wafer and the protective film is diced for each circuit formed on the wafer surface.

The dicing is performed to cut both of the wafer and the protective film, so that the laminate of the semiconductor wafer and the protective film is diced into a plurality of chips. The dicing of the wafer is performed by a known method using a dicing sheet. Subsequently the diced chip is picked up by a general-purpose means such as a collet, so that a semiconductor chip having a protective film on the back surface (protective film-equipped chip) can be obtained.

The manufacturing method of the semiconductor chip is not limited to the example described above. For example, the release of the support sheet or the release sheet may be performed after heat-curing and/or light curing of the protective film formation layer or after dicing.

In the case of releasing the support sheet or the release sheet after dicing, the support sheet or the release sheet can play a role as dicing sheet.

Alternatively, a protective film-equipped chip may be manufactured by performing the dicing before curing the protective film formation layer for the processing into an uncured protective film formation layer-equipped chip, and then heat-curing and/or light-curing the protective film formation layer of the chip.

EXAMPLES

The mass average molecular weight (Mw) and the number average molecular weight (Mn) of the components for use in the following Examples and Comparative Examples are measured values by the methods to be described below, and the glass transition temperature of an acrylic-based copolymer is a calculated value by the method to be described below.

<Mass Average Molecular Weight (Mw) and Number Average Molecular Weight (Mn)>

Measurement was performed under the following conditions using a gel permeation chromatography apparatus (product name: "HLC-8220 GPC", manufactured by Tosoh Corporation), and the value measured in standard polystyrene equivalent was used.

(Measurement Conditions)

Column: "TSK guard column HXL-H", "TSK gel GMHXL (×2)", "TSK gel G2000 HXL" (all of them are manufactured by Tosoh Corporation)

Column temperature: 40° C.
Developing solvent: tetrahydrofuran
Flow rate: 1.0 mL/min <Glass Transition Temperature (Tg)>

Using the formula (1) described above, the glass transition temperature (Tg) was calculated for each of the composition ratio of the individual monomer components in degrees Celsius (° C.). The glass transition temperature of the homopolymer of each the monomer components for use in the calculation is as follows.

n-butyl acrylate (BA): −54° C.
methyl acrylate (MA): 10° C.
glycidyl methacrylate (GMA): 41° C.
2-hydroxyethyl acrylate (HEA): −15° C.

<Average Particle Size and Aspect Ratio of Each Component>

Using methyl ethyl ketone as dispersion medium, a dispersion liquid of each component having a solid content of 5 mass % was prepared. Using the dispersion liquid, the average particle size (major axis number average size) and the aspect ratio (major axis number average size/minor axis number average size) of each the components was measured by a laser diffraction particle size distribution measuring apparatus (product name "LA-920", manufactured by Horiba, Ltd.).

Examples 1 to 6 and Comparative Examples 1 and 2

(1) Preparation of Composition for Protective Film Formation

The individual components of the type and blend amount shown in the following Tables 1-1 and 1-2 were blended, and then a methyl ethyl ketone solution was added so that the effective component concentration is 61 mass %; thus, a solution of the composition for protective film formation was obtained.

The blend amount of each component shown in Table 1-1 represents the mass ratio of each component (effective component ratio) relative to 200 parts by mass of the total of "polymer components" and "curable resins" as resin components (effective components) in the composition for protective film formation. The blend amount of each component described in Table 1-2 represents the content of each component (ratio of effective component) in the total amount of the composition for protective film formation (effective components: 100 mass %).

Herein, the "effective component" means the component other than water and the organic solvents contained in an object.

Each the components described in the following Tables 1-1 and 1-2 for use in Examples and Comparative Examples are as follows.

<Polymerizable Component>

"A-1": an acrylic copolymer obtained by polymerization of 55 parts by mass of n-butyl acrylate (BA), 10 parts by mass of methyl acrylate (MA), 20 parts by mass of glycidyl methacrylate (GMA), and 15 parts by mass of 2-hydroxyethyl acrylate (HEA), (BA/MA/GMA/HEA=55/10/20/15 (mass %)), Mw: 800,000, Tg: −28° C., density: 1.19 g/cm$^3$, solid at 25° C.

<Curable Component>
(Curable Resin)

trade name: "YL 980", manufactured by Mitsubishi Chemical Corporation, a bisphenol A-type epoxy resin, liquid at 25° C., epoxy equivalent: 180 to 190, viscosity at 25° C.:

100 to 200 P [gardner holdt](10 to 20 Pa·s), Mw: 360 (estimated from epoxy equivalent), density: 1.17 g/cm³.

trade name: "HP 7200 HH", manufactured by DIC Corporation, a dicyclopentadiene-type epoxy resin, epoxy equivalent: 270, softening point: 89° C., Mw: 1,000, density: 1.19 g/cm³, solid at 25° C.

(Thermosetting Agent)

trade name: "DICY", manufactured by Mitsubishi Chemical Corporation, dicyandiamide, solid at 25° C., molecular weight (formula weight): 84.1, density: 1.40 g/cm³, solid at 25° C.

(Curing Catalyst)

trade name: "2PH-Z", manufactured by Shikoku Chemicals Corporation, 2-phenyl-4,5-dihydroxymethylimidazole, solid at 25° C., molecular weight (formula weight): 204.2, density: 1.03 g/cm³, solid at 25° C.

<Heat Conductive Filler> trade name: "CB-PO2J", manufactured by Showa Denko K. K., spherical alumina particles, aspect ratio: 1.1, average particle size: 3.0 μm, thermal conductivity: 40 W/(m·K), density: 3.98 g/cm³, solid at 25° C.

trade name: "CB-P05J", manufactured by Showa Denko K. K., spherical alumina particles, aspect ratio: 1.1, average particle size: 5.0 μm, thermal conductivity: 40 W/(m·K), density: 3.98 g/cm³, solid at 25° C.

trade name: "AE2050-MOD", manufactured by Admatechs Co., Ltd., spherical alumina particles, aspect ratio: 1.1, average particle size: 0.5 μm, thermal conductivity: 40 W/(m·K), density: 3.98 g/cm³, solid at 25° C.

<Coloring Agent> trade name: "MA-600B", manufactured by Mitsubishi Chemical Corporation, carbon black, average particle size: 20 nm, density: 2.00 g/cm³, solid at 25° C.

<Silane Coupling Agent> trade name: "X-41-1056", manufactured by Shin-Etsu Co., Ltd., an oligomer-type silane coupling agent, liquid at 25° C., methoxy equivalent: 17.1 mmol/g, number average molecular weight (Mn): 500 to 1500, density: 1.19 g/cm³.

TABLE 1-1

| (Part by mass)* | Polymer component A-1 | Curable component — Curable resin — Liquid epoxy resin YL980 | Curable component — Curable resin — Solid epoxy resin 7200HH | Curable component — Curing agent Dicyandiamide DICY | Curable component — Curing catalyst Imidazole 2PH-Z | Heat conductive filler — Spherical alumina particle — Particle size 3.0 μm CB-P02J | Heat conductive filler — Spherical alumina particle — Particle size 5.0 μm CB-P05J | Heat conductive filler — Spherical alumina particle — Particle size 0.5 μm AE2050-MOD | Carbon black MA-600B | Coupling agent X-41-1056 | Liquid component content *1 (part by mass) | Heat conductive filler content *2 (volume %) |
|---|---|---|---|---|---|---|---|---|---|---|---|---|
| Example 1 | 100 | 70 | 30 | 3.10 | 3.10 | 956 | — | — | 10 | 2.00 | 34.9 | 57.0 |
| Example 2 | 100 | 100 | — | 3.44 | 3.44 | 960 | — | — | 10 | 2.00 | 49.3 | 57.0 |
| Example 3 | 70 | 130 | — | 4.48 | 4.48 | 970 | — | — | 10 | 2.00 | 63.2 | 57.0 |
| Example 4 | 100 | 70 | 30 | 3.10 | 3.10 | — | 956 | — | 10 | 2.00 | 34.9 | 57.0 |
| Example 5 | 100 | 100 | — | 3.44 | 3.44 | — | 960 | — | 10 | 2.00 | 49.3 | 57.0 |
| Example 6 | 100 | 70 | 30 | 3.10 | 3.10 | 720 | — | — | 10 | 2.00 | 34.9 | 50.0 |
| Comparative Example 1 | 100 | 70 | 30 | 3.10 | 3.10 | — | — | 956 | 10 | 2.00 | 34.9 | 57.0 |
| Comparative Example 2 | 20 | 180 | — | 6.19 | 6.19 | 994 | — | — | 10 | 2.00 | 85.7 | 57.1 |
| Comparative Example 3 | 100 | 70 | 30 | 3.10 | 3.10 | 1653 | — | — | 10 | 2.00 | 34.9 | 69.7 |

*The mass ratio of each component (effective component ratio) is shown relative to 200 parts by mass of the total of polymer components and curable resins (effective components) in the composition for protective film formation.
*1: The content (part by mass) of liquid components ("liquid epoxy resin (YL 980)" + "coupling agent (X-41-1056)") contained in the composition is shown relative to 100 parts by mass of the total of polymer components and curable components.
*2: The content (volume %) of heat conductive filler is shown relative to the total amount (total volume) of the composition for protective film formation.

TABLE 1-2

| (Mass %)** | Polymer component A-1 | Curable component — Curable resin — Liquid epoxy resin YL980 | Curable component — Curable resin — Solid epoxy resin 7200HH | Curable component — Curing agent Dicyandiamide DICY | Curable component — Curing catalyst Imidazole 2PH-Z | Heat conductive filler — Spherical alumina particle — Particle size 3.0 μm CB-P02J | Heat conductive filler — Spherical alumina particle — Particle size 5.0 μm CB-P05J | Heat conductive filler — Spherical alumina particle — Particle size 0.5 μm AE2050-MOD | Carbon black MA-600B | Coupling agent X-41-1056 |
|---|---|---|---|---|---|---|---|---|---|---|
| Example 1 | 8.52 | 5.96 | 2.55 | 0.26 | 0.26 | 81.42 | — | — | 0.85 | 0.17 |
| Example 2 | 8.48 | 8.48 | — | 0.29 | 0.29 | 81.43 | — | — | 0.85 | 0.17 |
| Example 3 | 5.88 | 10.92 | — | 0.38 | 0.38 | 81.45 | — | — | 0.84 | 0.17 |
| Example 4 | 8.52 | 5.96 | 2.55 | 0.26 | 0.26 | — | 81.42 | — | 0.85 | 0.17 |
| Example 5 | 8.48 | 8.48 | — | 0.29 | 0.29 | — | 81.43 | — | 0.85 | 0.17 |
| Example 6 | 10.66 | 7.46 | 3.20 | 0.33 | 0.33 | 76.74 | — | — | 1.07 | 0.21 |
| Comparative Example 1 | 8.52 | 5.96 | 2.55 | 0.26 | 0.26 | — | — | 81.42 | 0.85 | 0.17 |
| Comparative Example 2 | 1.64 | 14.77 | — | 0.51 | 0.51 | 81.58 | — | — | 0.82 | 0.16 |

TABLE 1-2-continued

| | | Curable component | | | | Heat conductive filler Spherical alumina particle | | | | |
|---|---|---|---|---|---|---|---|---|---|---|
| | | Curable resin | | Curing | | | | Particle size | Carbon | |
| (Mass %)** | Polymer component A-1 | Liquid epoxy resin YL980 | Solid epoxy resin 7200HH | Curing agent Dicyandiamide DICY | catalyst Imidazole 2PH-Z | Particle size 3.0 μm CB-P02J | Particle size 5.0 μm CB-P05J | 0.5 μm AE2050-MOD | black MA-600B | Coupling agent X-41-1056 |
| Comparative Example 3 | 5.34 | 3.74 | 1.60 | 0.17 | 0.17 | 88.34 | — | — | 0.53 | 0.11 |

**The content of each component (effective component ratio) is shown relative to the total amount (etffective components: 100 mass %) of the composition for protective film formation.

(2) Fabrication of a Sheet for Protective Film Formation

The solution of the composition for protective film formation mentioned above was applied onto the release treatment surface of a release sheet release-treated with silicone (trade name: "SP-PET 381031", manufactured by LINTEC Corporation, thickness: 38 μm) using a roll-type coating apparatus so that the thickness after drying is 25 μm; thus, a coating film was formed.

Subsequently, drying processing was performed on the formed coating film at 110° C. for 2 minutes to form a protective film formation layer with a thickness of 25 μm, and a release sheet of the same type as the above separately prepared was attached to the exposed surface of the protective film formation layer; thus, a sheet for protective film formation was fabricated.

Using the sheet for protective film formation, a protective film-equipped chip was manufactured by the following method. In the manufacturing process, various properties of the sheet for protective film formation and the protective film-equipped chip were evaluated. The evaluation results are shown in Table 2.

(I) Attachability of Protective Film Formation Layer

The sheet for protective film formation manufactured in Examples or Comparative Examples with one of the release sheets peeled off was attached onto the ground surface of a silicon wafer (diameter: 200 mm, thickness: 280 μm) ground with #2000, using a tape mounter (trade name: "Adwill RAD-3600 F/12", manufactured by LINTEC Corporation) while heating was performed at 70° C., so that a protective film formation layer-equipped silicon wafer was manufactured.

When the protective film formation layer was attached by the tape mounter, it was confirmed whether the layer can be attached without defects such as fractures, so that the attachability of the protective film formation layer was evaluated by the following criteria.

<1>: The sheet was able to be attached without defects such as fractures of the protective film formation layer.
<2>: Although small fractures were found in the protective film formation layer, it was determined to be able to withstand dicing.
<3>: Large fractures were found in the protective film formation layer, so that it was determined to be unable to withstand dicing.
<4>: The sheet for protective film formation was unable to be attached to a silicon wafer.

(II) Gloss Value of Protective Film

The a protective film formation layer-equipped silicon wafer manufactured in (I) described above with the other release sheet peeled off was introduced in an environment at 130° C. for 2 hours for the complete curing of the protective film, so that a protective film-equipped silicon wafer was obtained. Then, the specular gloss at 60 degrees of the formed protective film was measured in accordance with JIS Z 8741 using a glossmeter (product name: "VG 2000", manufactured by Nippon Denshoku Industries Co., Ltd.), and the measured value was taken as the gloss value of the protective film.

It is determined that the visibility of the protective film at a laser printed portion is more excellent, as the gloss value of the protective film increases.

(III) Thermal Conductivity of Protective Film

The sheet for protective film formation was introduced into an environment at 130° C. for 2 hours for the complete curing of the protective film formation layer. Subsequently the thermal diffusivity of the cured protective film formation layer was measured with a thermal diffusivity and thermal conductivity measurement apparatus (product name: "ai-Phase Mobile 1u", manufactured by ai-Phase Co., Ltd.) so as to measure the thermal diffusivity of the protective film. And the thermal conductivity of the protective film was calculated from the following calculation formula (2). The specific heat of the single body of the protective film was calculated by the DSC method, and the density was calculated by the Archimedes method.

Thermal conductivity (W/m·K)=Thermal diffusivity× Density×Specific heat    Calculation Formula (2)

(IV) Reliability of Protective Film-Equipped Chip

A dicing tape (trade name: "Adwill D-676H", manufactured by LINTEC Corporation) was attached to the side of the exposed protective film of the protective film-equipped silicon wafer manufactured in (II) described above. Then, the silicon wafer was diced to a size of 3 mm×3 mm using a dicing apparatus (product name: "DFD 651", manufactured by DISCO corporation); thus, protective film-equipped chips were obtained.

25 protective film-equipped semiconductor chips fabricated were placed in a thermal shock apparatus (product name: "TSE-11A", manufactured by ESPEC Corp.), and one cycle of "keeping at −40° C. for 10 minutes and then keeping at 125° C. for 10 minutes" was repeated 1000 times.

After that, the cross-section of the protective film-equipped chips taken out of the thermal shock apparatus was observed by a scanning ultrasonic flaw detector (product name: "Hye-Focus", manufactured by Hitachi Kenki FineTech Co., Ltd.), so that the presence or absence of lifting-off, peeling-off, or cracks in the joint portion between the chip and the protective film was confirmed.

A protective film-equipped chip in which lifting-off, peeling-off, and cracks were seen was evaluated as "NG". The number of the protective film-equipped chips determined as "NG" out of 25 protective film-equipped chips observed is shown in Table 2. The reliability of the protective film-equipped chip is more excellent, as the number decreases.

TABLE 2

| | Composition for protective film formation | | | Evaluation item | | | |
|---|---|---|---|---|---|---|---|
| | Liquid component content *1 (part by mass) | Heat conductive filler content *2 (volume %) | Average particle size of heat conductive filler (μm) | (I) Attachability of sheet for protective film formation | (II) Gloss value of protective film (—) | (III) Thermal conductivity of protective film (W/(m · K)) | (IV) Reliability of protective film-equipped chip (NG number/25) |
| Example 1 | 34.9 | 57.0 | 3.0 | <1> | 22 | 3.0 | 0/25 |
| Example 2 | 49.3 | 57.0 | 3.0 | <1> | 30 | 3.0 | 0/25 |
| Example 3 | 63.2 | 57.0 | 3.0 | <2> | 39 | 3.0 | 0/25 |
| Example 4 | 34.9 | 57.0 | 5.0 | <1> | 12 | 3.0 | 0/25 |
| Example 5 | 49.3 | 57.0 | 5.0 | <1> | 19 | 3.0 | 0/25 |
| Example 6 | 34.9 | 50.0 | 3.0 | <1> | 30 | 2.5 | 0/25 |
| Comparative Example 1 | 34.9 | 57.0 | 0.5 | <4> | (*3) | 1.9 | (*3) |
| Comparative Example 2 | 85.7 | 57.1 | 3.0 | <3> | (*3) | 3.2 | (*3) |
| Comparative Example 3 | 34.9 | 69.7 | 3.0 | <4> | (*3) | (*3) | (*3) |

*1: The content (part by mass) of liquid components ("liquid epoxy resin (YL 980)" + "coupling agent (X-41-1056)") contained in the composition is shown relative to 100 parts by mass of the total of polymer components and curable components.
*2: The content (volume %) of heat conductive filler is shown relative to the total amount (total volume) of the composition for protective film formation.
*3. Terminated without evaluation, due to the extremely fragile protective film formation layer of the manufactured sheet for protective film formation.

The protective film formation layers of the sheets for protective film formation manufactured in Examples 1 to 6 had excellent attachability by a tape mounter. The protective film formed by curing the protective film formation layer had a high gloss value and excellent visibility at a laser printed character portion, being excellent in heat dissipation due to high heat conductivity. Further, the protective film-equipped chip manufactured using the sheet for protective film formation had excellent reliability.

In contrast, the sheets for protective film formation manufactured in Comparative Examples 1 to 3 were unable to be attached, or were insufficiently attached, to a silicon wafer, so that the operation was terminated without evaluation of the gloss value of the protective films and the reliability of the protective film-equipped chips. In Comparative Example 3, the thermal conductivity of the protective film also was not evaluated.

In Comparative Example 1, due to inferior initial attachability of the formed protective film formation layer, the sheet for protective film formation was unable to be attached to a silicon wafer. Furthermore, due to the small average particle size of the heat conductive filler, the specific surface area of the filler increased, so that the heat loss increased by the increase of the contact area with other components in the protective film. As a result, the thermal conductivity of the protective film decreased.

In Comparative Example 2, when one of the release sheets of the sheet for protective film formation was removed, the protective film formation layer was peeled off together with the release sheet due to a large content of the liquid component in the composition for protective film formation, which caused a problem in workability of attachment. Furthermore, when the protective film formation layer of the sheet for protective film formation was attached using a tape mounter, a large fractures were found in the protective film formation layer, which caused a problem in attachability by a tape mounter.

In Comparative Example 3, due to a large content of the heat conductive filler in the composition for protective film formation, the formed protective film formation layer was extremely fragile, so that the evaluation of the gloss value of the protective film and the reliability of the protective film-equipped chip was unable to be performed.

INDUSTRIAL APPLICABILITY

The composition for protective film formation of the present invention is suitable as a material for forming a protective film that protects the back surface of a semiconductor chip.

REFERENCE SIGNS LIST 1a, 1b, 1c, 1d sheet for protective film formation
2 protective film formation layer
3, 3a, 3b release sheet
4 support sheet
5 pressure sensitive adhesive layer

The invention claimed is:
1. A composition for protective film formation, the composition comprising
   (A) a polymer component (A);
   (B) a curable component (B); and
   (C) a heat conductive filler (C) having an average particle size of 2.0 to 10.0 μm, wherein:
   a content of components that are liquid at 25° C. contained in the composition is 20 to 70 parts by mass relative to 100 parts by mass of the total of the (A) component and the (B) component; and
   a content of the (C) component is 52 to 65 volume % relative to 100 volume % of a total amount of the composition.
2. The composition according to claim 1, wherein the heat conductive filler (C) is a particle comprising one or more components selected from the group consisting of alumina, zinc oxide, magnesium oxide, titanium, silicon carbide, boron nitride, aluminum nitride, and glass.

3. The composition according claim 1, wherein the heat conductive filler (C) is a spherical heat conductive filler.

4. The composition according to claim 1, wherein the polymer component (A) comprises an acrylic-based polymer (A1) which is a copolymer having a constituent unit (a1) derived from an alkyl (meth)acrylate having an alkyl group with 1 to 18 carbon atoms and a constituent unit (a2) derived from a functional group-containing monomer.

5. The composition according to claim 1, wherein
a content of the polymer component (A) is 3 to 45 mass %,
a content of the curable component (B) is 3 to 45 mass %, and
a content of the heat conductive filler (C) is 35 to 90 mass %, relative to 100 mass % of the total amount of the composition.

6. A sheet for protective film formation, the sheet comprising a protective film formation layer formed of the composition of claim 1.

7. The sheet according to claim 6, wherein the protective film formed by curing the protective film formation layer has a thermal conductivity of 2.0 W/(m·K) or more.

8. The sheet according to claim 6, wherein the protective film formed by curing the protective film formation layer has a gloss value of 10 or more.

9. A protective film-equipped chip having, on the chip, a protective film formed by curing the protective film formation layer of the sheet of claim 6.

* * * * *